US005731956A

United States Patent [19]
Nicolici

[11] Patent Number: 5,731,956
[45] Date of Patent: Mar. 24, 1998

[54] ELECTRONIC DEVICES FOR CONNECTION INTO BACK PLANES

[75] Inventor: Radu-Marko Nicolici, Hull, Canada

[73] Assignee: Northern Telecom Limited, Montreal, Canada

[21] Appl. No.: 694,123

[22] Filed: Aug. 8, 1996

[51] Int. Cl.⁶ .................................................. H05K 7/20
[52] U.S. Cl. .................. 361/715; 361/732; 361/733; 361/735; 361/744; 361/789; 361/802; 361/803
[58] Field of Search .................. 361/679, 690, 361/710, 715–716, 725, 727, 732, 733, 735, 736, 742, 744, 786, 796, 789, 787, 790, 801–804; 439/57, 61, 64, 677, 701, 924.1

[56] References Cited

U.S. PATENT DOCUMENTS

| | | | |
|---|---|---|---|
| 3,541,396 | 11/1970 | Cardwell et al. | 361/803 |
| 4,048,669 | 9/1977 | Bowler et al. | 361/801 |
| 4,109,299 | 8/1978 | Cosentino et al. | 361/803 |
| 4,503,484 | 3/1985 | Moxon | 361/803 |
| 4,602,316 | 7/1986 | Feick | 361/803 |
| 4,642,735 | 2/1987 | Hodsdon et al. | 361/399 |
| 4,916,575 | 4/1990 | Van Asten | 361/736 |

Primary Examiner—Gregory D. Thompson
Attorney, Agent, or Firm—R. J. Austin

[57] ABSTRACT

An electronic assembly of two planar electronic devices for insertion into a shelf for back plane connection. Each device may be a printed circuit board or a circuit pack incorporating such a board. A flexible flat cable extends between front ends of the devices to interconnect their circuitry. This cable is torsionally flexible to allow relative pivoting movement of the electronic devices in their respective planes. The cable is also bendably flexible to allow movement towards each other or apart of the rears of the electronic devices. A movement limiting device restricts the degree of relative movement of the electronic devices. The relative movement overcomes tolerance issues between terminal positions of one device relative to the other during connection into the back plane and damage to terminals and connectors is avoided.

12 Claims, 6 Drawing Sheets

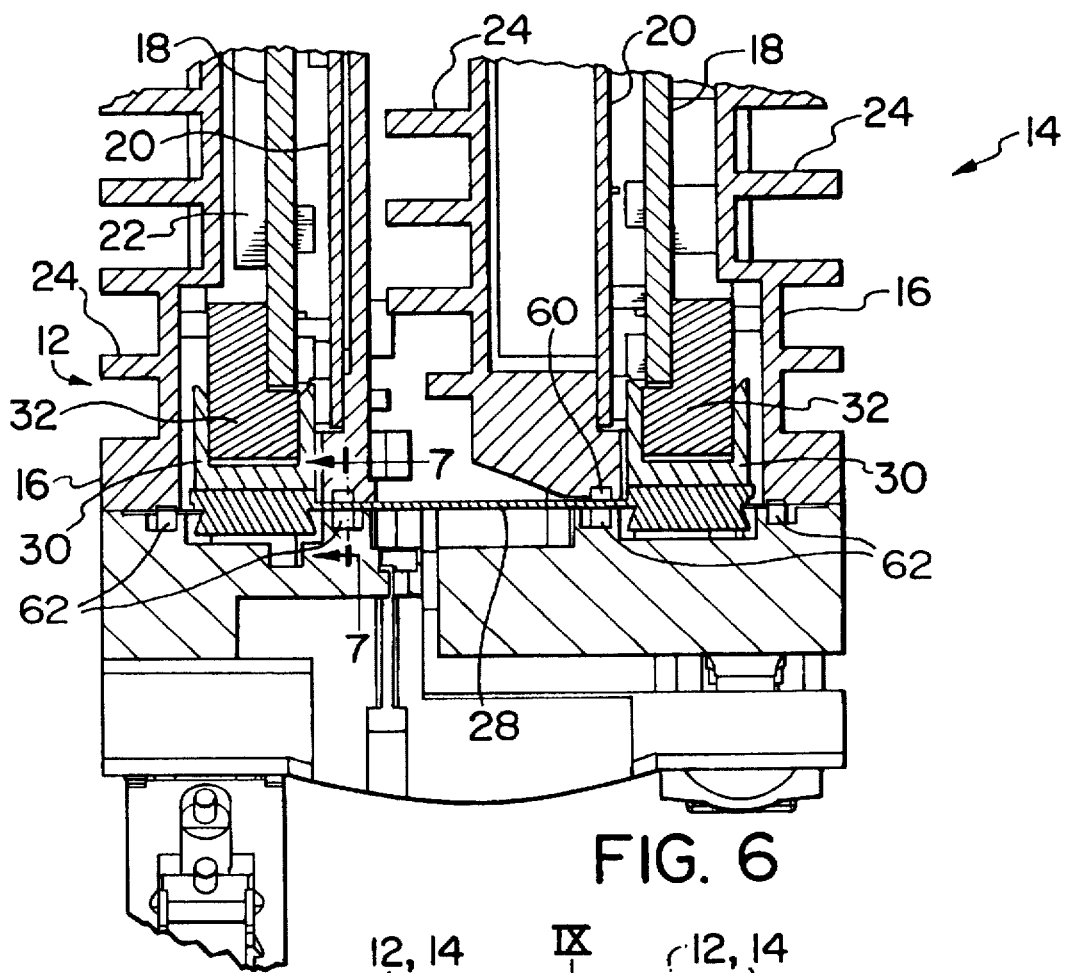
FIG. 6
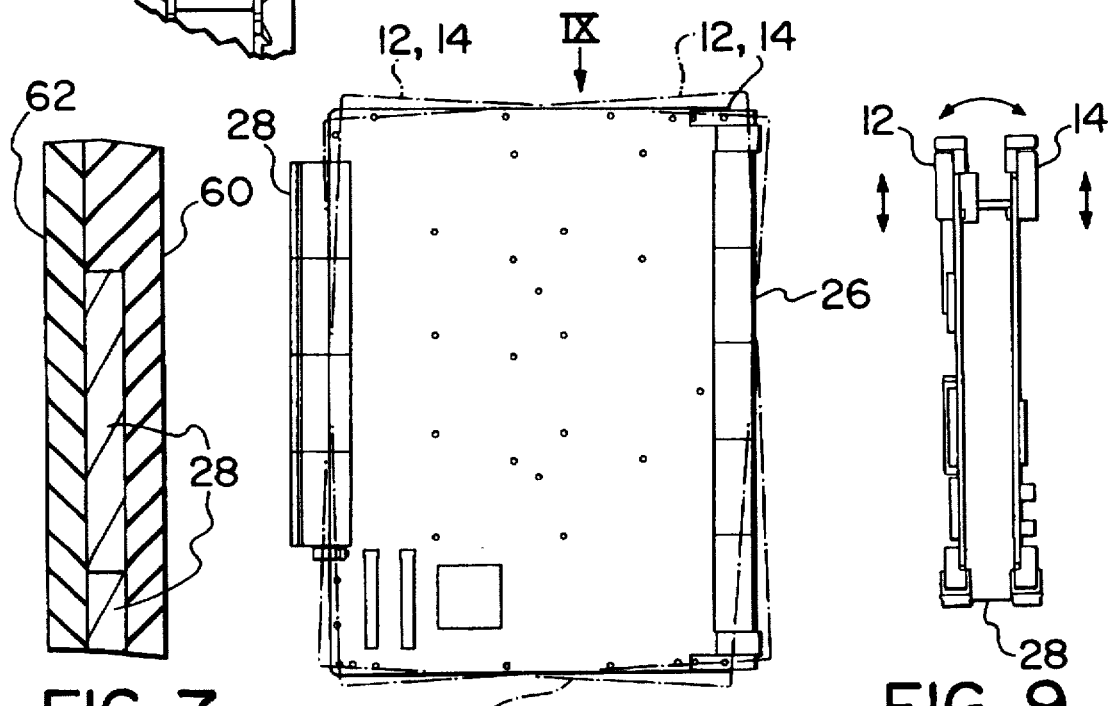
FIG. 7
FIG. 8
FIG. 9

ELECTRONIC DEVICES FOR CONNECTION INTO BACK PLANES

This invention relates to electronic devices for connection into back planes.

Electronic devices are known which are connectable with back planes in shelves and such devices may basically consist of printed circuit boards with electronic components mounted thereon (referred to as edge cards) and which are slidably received in receiving stations in shelves for connection by rear mounted connectors with mating connectors in the back planes. Adjacent edge cards are sometimes interconnected along front edges by flexible flat cables. To achieve this construction, it is conventionally necessary for the customer, i.e. the user of equipment incorporating the shelves, to insert the edge cards separately into the shelves and then to interconnect them with the flat cable with connector arrangements. Alternatively, an electronic device for connection with a back plane may comprise at least one printed circuit board possibly carrying electronic components, and which is housed within a heat sink arrangement which is suitably designed for removing heat from the electronic components and dispersing it into the ambient atmosphere. With such an arrangement it is again possible for a flat cable to connect the printed circuit board or boards of one such electronic device with a board of an adjacent device, but of course the heat sink construction increases any problems in making the interconnection. These problems are again placed upon the user who needs to make the assembly himself in situ with the two electronic devices being placed into the shelves and then the flat cable being connected between them. Assembly problems are again increased in situations where it is desired for the printed circuit boards of the electronic devices to be provided with electromagnetic radiation shields. In such instances the user is again required to form the connection between the devices and he is responsible for correctly assembling the EMI shield elements. Particularly in the latter instance, correct operation of electronic devices is extremely dependent upon the skill of the user in forming its assembly within a shelf. With regard to the formation of the electromagnetic shielding, the efficiency of the shielding will obviously depend upon the skill and the procedure followed in the assembly process and stray electromagnetic radiation may well result and which could have an effect upon the operation of other printed circuit boards or equipment stationed nearby.

The present invention seeks to provide an assembly of electronic device which will minimize the above problems.

Accordingly, the present invention provides an electronic assembly comprising: two planar electronic devices for insertion into a shelf and into connection with a back plane with the electronic devices disposed side-by-side and with each electronic device comprising electrical circuitry lines and electronic components connected by the circuitry lines; an electrical connector at a rear end of each of the electronic devices for connection to a mating connector of the back plane; a flexible flat cable extending between front ends of the electronic devices to interconnect circuitry lines of one of the electronic devices with those of the other, the flat cable being torsionally flexible to allow relative pivoting movement of the electronic devices in their respective planes and being bendably flexible to allow relative pivoting movement of the electronic devices about the flat cable to move their rear ends towards each other or apart; and at least one movement limiting device extending between the electronic devices to limit the amount of their relative pivoting movement in their respective planes and about the flat cable.

Thus in the assembly the relative movement which is permitted between the planar electronic devices overcomes tolerance issues between terminal positions of one device relative to those of the other. Thus the terminal positions of each device are movable relative to the terminal positions of the other device to allow for terminal connections to be made with corresponding connectors on the back plane. Thus the chances of damage to terminals of either of the devices or of those of the back plane are avoided. Damage is also avoided to other connector parts.

In the simplest form, each electronic device comprises a printed circuit board and the two boards are interconnected by the flat cable without there being surrounding heat sinks or electromagnetic shields. In the simplest form, the movement limiting device is secured to the printed circuit boards themselves so as to hold them side-by-side in the assembly while allowing for their limited amount of movement. In more complex forms of the invention, each electronics device comprises at least one printed circuit board housed within a heat sink structure and preferably electromagnetic shielding is also provided. In this more complex arrangement, movement limiting device extends between the heat sink structures of the two adjacent devices.

The movement limiting device may take many forms to enable the limited movement to take place. For instance, the movement limiting device may comprise at least one pair of pivotally interconnected links which are also connected at remote ends (and with multidirectional pivoting capability), to their respective electronics devices. This multidirectional pivoting capability will enable the devices to be relatively moved in their own planes and also to be moved apart or towards each other at their rear ends by pivoting about the flat cable. However, the amount of movement provided between the electronics devices may be limited by a movement limiting device of more simple construction. For instance, in a preferred arrangement of the invention, the movement limiting device comprises at least one headed pin or projection extending from one of the electronic devices, the pin extending through a slot provided by the other electronics device with the head of the pin on the other side of the slot. The pin is permitted to move in an axial direction as the head is free to move on the other side of the slot. This axial direction of movement will permit the rear ends of the electronics devices to move towards each other and apart by flexing of the cable in bend. In addition, the pin or projection is permitted to move in the slot in a radial direction of the pin to permit the relative pivoting movement of the devices in their planes. While one such construction, i.e. one pin or projection with a slot is possible, it is preferred, for structural integrity, that two or more such structures are provided between the two electronics devices. In a preferred arrangement, at least two headed pins or projections and their accompanying slots are provided at a rear end region of the electronics devices and these are disposed preferably in remote positions of the devices. In addition, at least one headed pin or projection and accompanying slot is provided at a front end region between the two devices. In this position the restricted movement of the pin places restriction on the sideways movement of the two devices at the front end of the assembly, thereby preventing any undue twisting or bending of the flat cable.

An assembly according to the invention is particularly suitably designed for manufacture within a controlled factory environment and the two devices are held assembled together in side-by-side relationship by the movement limiting devices and with the flat cable extending between them. As a result of this, in each assembly whether or not EMI protection and/or heat sinks are provided, the flat cable is connected into the printed circuit boards in a factory environment and thus a correct interconnection with the flat cable is ensured. Hence, one of the responsibilities previously placed upon the end user has been removed and the end user is merely required to locate the assembly into a shelf with the two electronics devices moving simultaneously towards the back plane to be connected by their rear connectors into the back plane.

In addition to this, heat sinks are easily provided upon such an assembly, and the interconnection between the flat cable and printed circuit boards of the two electronics devices may also be protected by the heat sink and thus is not subject to subsequent interference after leaving the factory. In addition, it is possible to provide electromagnetic shield arrangements under controlled factory conditions thereby ensuring a particularly high standard of shielding. This shielding in particular is concerned with the shielding of the interconnection between the flat cable and the connectors at the fronts of printed circuit boards of the two electronics devices. For this purpose the electronics devices may include front housing members which have electromagnetic shielding seals to prevent radiation from passing from the connectors outwardly from the total assembly.

In a further preferred arrangement, relative movement between the two electronics devices is also allowable in their planes in a front to rear direction. This arrangement enables each of the devices to be connected by their rear connectors into the back plane separately upon insertion of the assembly into a shelf. Thus, insertion resistance problems may be lessened in that the insertion of all of the rear connectors of the assembly simultaneously into the back plane may be avoided. Thus with this preferred arrangement, upon the assembly reaching the back plane during insertion into the shelf, one device is then moved rearwardly for interconnection with the back plane followed by movement of the other device also in the rearward direction to achieve back plane interconnection. The movement of the two devices in their planes by twisting of the flat cable or movement of the rear ends of the devices towards or away from each other enables both of the rear connectors to be aligned with their respective mating connectors in the back plane thereby ensuring interconnection of the whole of the assembly onto the back plane construction.

Embodiments of the invention will now be described, by way of example, with reference to the accompanying drawings, in which:

FIG. 6 is a cross-sectional view along line VI—VI in FIG. 1 and to a larger scale;

FIG. 7 is a cross-sectional view along line VII—VII in FIG. 6;

FIG. 8 is a diagrammatic side elevational view of the assembly to show relative movement of the devices of the assembly;

FIG. 9 is a diagrammatic plan view in the direction of arrow IX in FIG. 8 to show relative movement;

Figure 1:
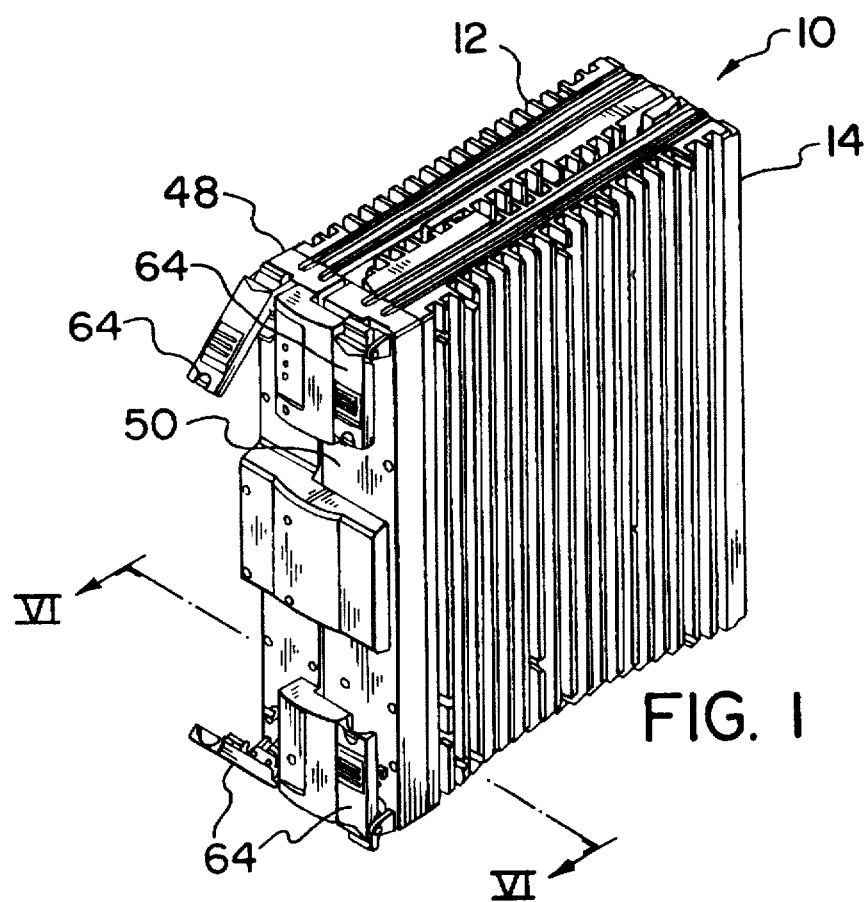
FIG. 1 is a perspective view from the front of an assembly according to a first embodiment.

In a first embodiment as shown in FIG. 1 an assembly 10 comprises two planar electronics devices 12 and 14 disposed in side-by-side relationship. As shown partially diagrammatically in FIG. 6, each electronic device 12 and 14 comprises a heat sink structure 16 forming a housing for two laterally spaced face-to-face printed circuit boards located within the device, these boards comprising a main function board 18 and a power board 20. Each of the boards carries electronic components 22 as required. The heat sink housings 16 of each exchange device has fins 24 extending externally of the housings for removing heat from the boards and from the electronic components 22 in known manner, the fins 24 between the devices 10 and 12 extending towards each other. Each device has a rear end at which is provided a female connector 26 (FIG. 8) for connection with a mating connector of a back plane as will be described. Front ends of the devices 10 and 12 are connected together by a flat cable arrangement (FIG. 5) which includes a plurality, namely four, flat cables 28 which lie in series vertically side-by-side in coplanar arrangement. The cables 28 have end connectors 30 which are interconnected (as shown by FIG. 6) with front end connectors 32 on the front ends of the main function boards 18.

The assembly 10 is prebuilt with the heat sinks surrounding the printed circuit boards and electromagnetic shielding is provided at front end regions of the assembly so as to enshroud the cables 28 as will be described. Also, as will be described, as the assembly is prebuilt some means must be provided to prevent opening apart of the devices 12 and 14 beyond a very limited degree so that the integrity of the structure may be maintained with the devices 12 and 14 remaining side-by-side. In addition, it is intended that the devices 12 and 14 should have some limited degree of movement in the following relative directions: 1) movement towards each other or apart of the rear ends of the devices in limited fashion for instance, as shown by the curved arrow in FIG. 9; 2) relative front to rear movement of the devices 12 and 14 as shown by the straight line arrows in FIG. 9; and 3) relative movement of the devices 12 and 14 in pivoting fashion as shown by the chain-dotted outlines and the arrows in FIG. 8.

Such movements are essential if the two connectors 26 at the rear ends of the devices 12 and 14 are to be inserted into mating connectors in a back plane of the shelf into which the device 10 is to be fitted.

Figure 2:
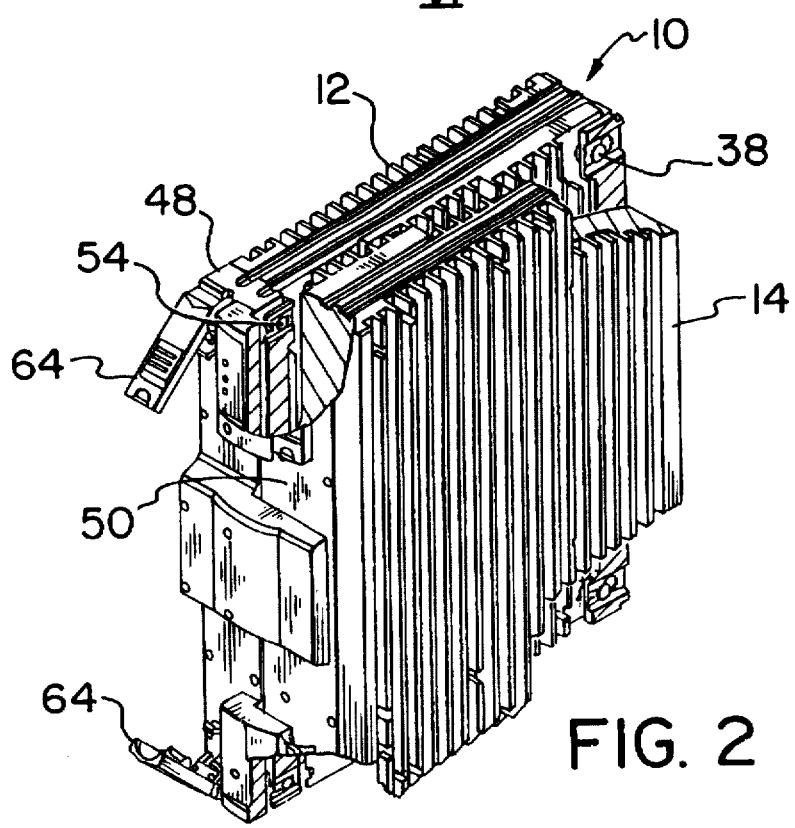
FIG. 2 is a view similar to FIG. 1 with parts removed to show detail of movement limiting elements of the assembly of FIG. 1.

To allow for these types of movement, movement limiting elements are provided. Insofar as rear end regions of the devices 12 and 14 are concerned, as shown in FIG. 2, but in detail in FIGS. 3 and 4, at remote regions of the devices, i.e. at the top and bottom of the assembly, the movement limiting devices comprise two pins 34 which are secured to the heat sink housing 16 of the device 12 and extend towards the device 14. Each of these pins 34 extends through a slot 36 of the device 14 and has a head 38 received in a chamber 40 behind the slot. The slot 36 extends in a rearward direction and has a wider rear end 42 sufficiently large to receive the head 38 for reception of the pin 34 in the slot 36. Thus, the pin 34 is free to move along the slot 36. In addition, the width of the slot (FIG. 4) and the size of the chamber 40 is sufficient to allow lateral movement of the pin in a vertical direction as shown by arrows 44 in FIG. 4 and also in an axial direction a shown by arrows 46.

Each pin 34 is surrounded by a compression spring 35 which extends between the device 12 and an abutment member 37 which also surrounds the pin. The member 37 abuts against the device 14 at each side of the slot 36 whereby the spring 35 urges the devices 12 and 14 apart. The head 38 and the member 37 thus sandwich between them parts of device 14 which flank the slot 36.

Figure 5:
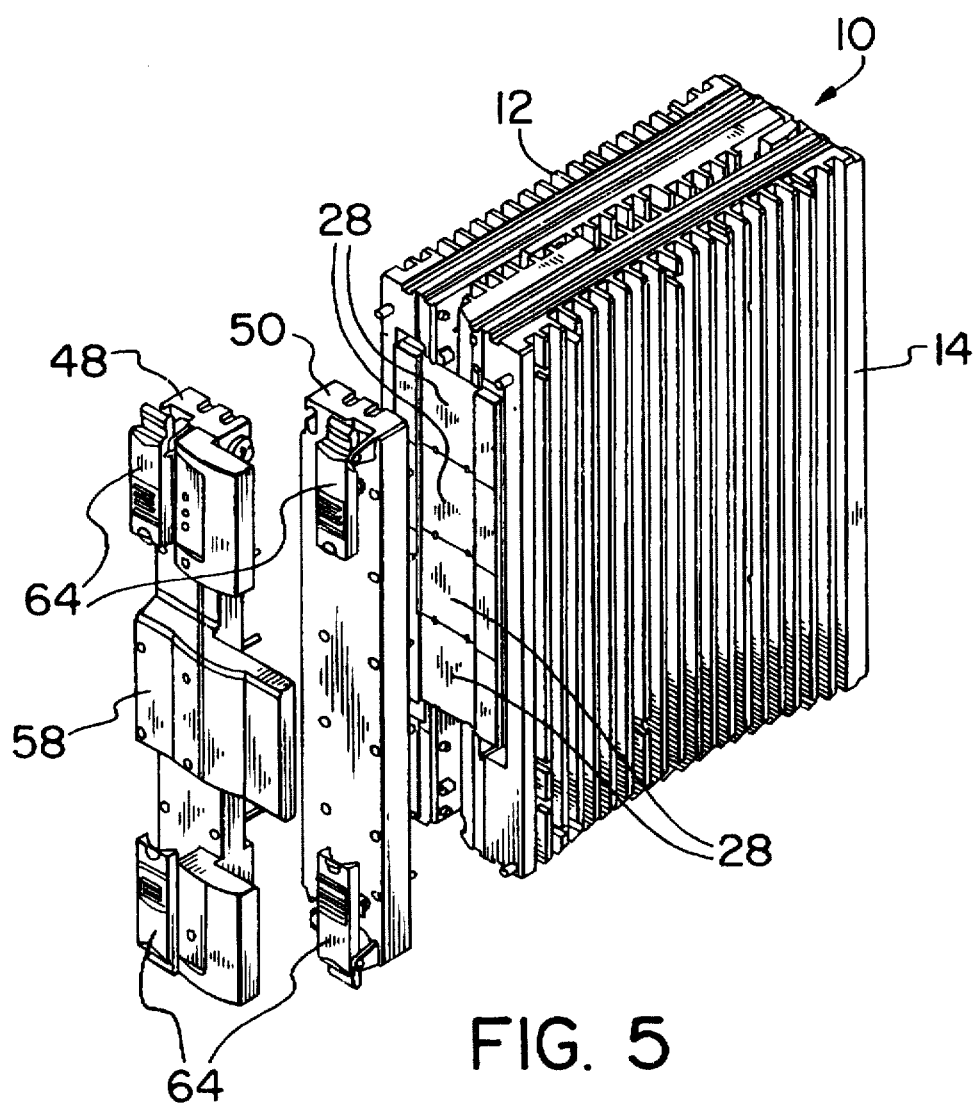
FIG. 5 is a view similar to FIG. 1, but in partially exploded condition.

At the front end of the housings 16, two front end fittings 48 and 50 are provided (FIGS. 1, 2 and 5). These front end fittings as will be described provide EMI shielding for the connectors 30 and 32 and also include further movement limiting elements.

Figure 3:
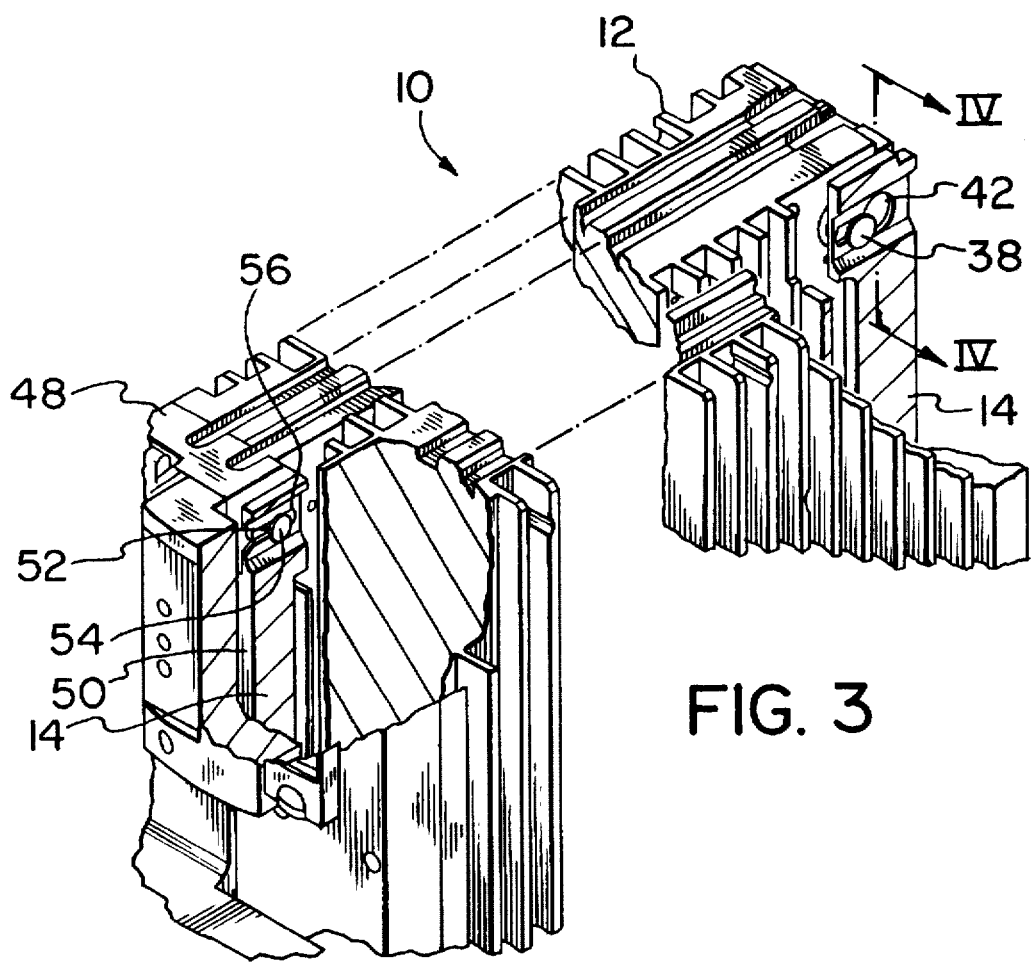
FIG. 3 is a view similar to FIG. 2 and showing the movement limiting elements to a larger scale.

As shown in FIGS. 2 and 3, front end fitting 48 comprises, at top and bottom, two pins 52 having heads 54, with the pins received in slots 56. The heads 54 are received in chambers (not shown) similar to the chambers 40 described above. The relationship of the pins 52 and heads 54 with regard to the slots 56 and associated chambers is similar to that described above with reference to FIG. 4 and allowance for movement of the pins and the heads are as previously discussed.

The front end fitting 50 is assembled onto the heat sink 16 of the device 14. Then the front end fitting 48 is fitted into position. This is permitted by the fact that the front end of the slot 56 is open in the fitting 50 so that the pins 52 may be slid from the front into the slots 56. This is clear from FIG. 3. The fitting 48 is then bolted onto the front end of the housing 16 of the device 12. A front bracket 58 of the fitting 48 extends across the front of the fitting 50 and while the slots 36 and 56 and their associated pins and heads allow a certain degree of relative front to rear movement (FIG. 9) of the devices 12 and 14, the bracket 58 prevents forward movement of the device 14 so as to prevent release of the pins 34 from the slots 36. The pins 52 will engage rear ends of their slots 56 as the device 14 engages the bracket 58 serving as a further prevention to release pins 34. Also the pins 52 cannot be removed from slot 56 by rearward movement of device 14 because the pins 34 will engage the forward ends of slots 36 before this may occur. Hence the assembly cannot be dismantled before the front bracket 58 is removed either separately or together with front end fitting 48.

As shown by FIGS. 6 and 7, the electromagnetic shield for the connectors 30 and 32 at the front end of each of the fittings 12 and 14 is provided by two vertical seals 60 and two continuous seals 62. A vertical seal 60 lies between each of the cables 28 and a front facing surface of the housing 16 of each device 12 and 14, the cables being sandwiched between seal 60 and a seal 62 received in a recess of the front end fitting 48 and 50. At top and bottom of the series of cables 28 the compressed seal 60 in a slightly less compressed condition extends outwardly so as to sealingly engage the seal 62 (FIG. 7). Each of the endless seals 62 has two vertical sides as shown in FIG. 6, these sides interconnected by curved top and bottom ends (not shown) located above and below the series of cables 28. The side of the seal 62 which is not in confrontation with the seal 60 does in fact seal with the housing 16 on the other side of the assembly of the connectors 30 and 32. Thus, a continuous seal is provided around each of these connector assemblies with the seal 62 extending completely around the connectors and engaging each of the cables 28. The cables themselves are clad in electromagnetic shielding material such as copper which is grounded when the device 10 is inserted into a shelf for operational purposes.

In addition, each of the devices 12 and 14 is provided with front latches 64 at top and bottom which may be of conventional construction as shown for holding the assembly 10 within a shelf.

Figure 4:
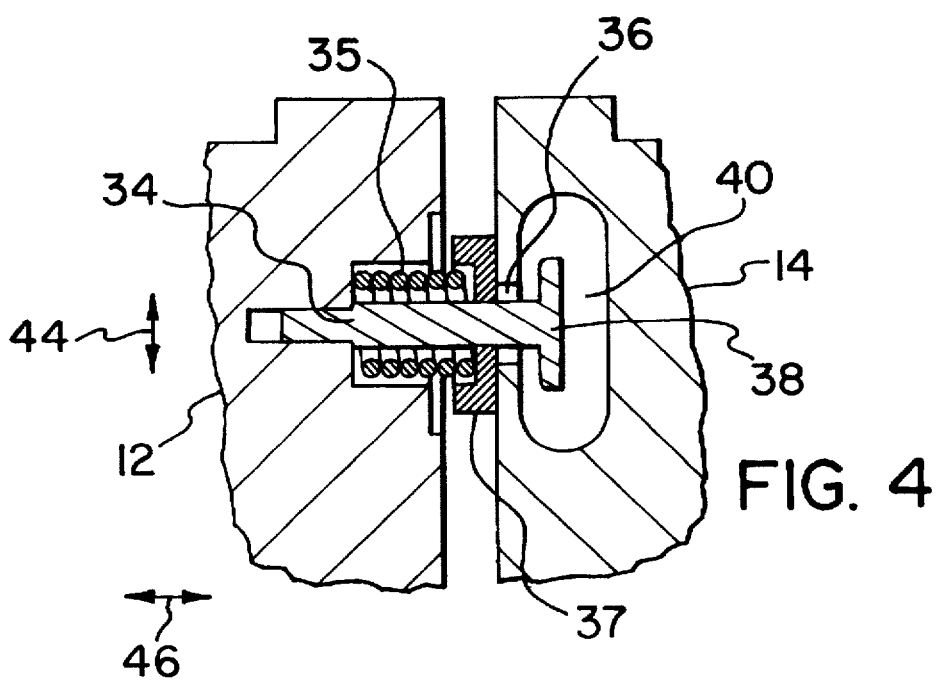
FIG. 4 is a view taken along line IV—IV in FIG. 3 to show detail.

With the assembly of the first embodiment, rear ends of the devices 12 and 14 are thus permitted to move relatively towards and away from each other as shown by the arcuate arrow in FIG. 9 and as permitted in the direction of arrow 46 in FIG. 4. This movement is accommodated by bending of each of the cables 28 in a flexible manner out of its plane. In addition, the relative movement of the pins in the direction of arrow 44 in FIG. 4 permits the devices 12 and 14 to move relatively in pivotal fashion as shown in FIG. 8. Also, the devices 12 and 14 may move relatively in a front to rear direction as shown by the full and dotted outlines in FIG. 9. This is permitted by the movement of the pins 34 and 52 longitudinally of the slots 36 and 56.

The device 10 is prebuilt in the factory and under strict factory conditions before being delivered to the customer. Thus in the assembly, the two devices 12 and 14 are relatively movable in the desired three directions between their limits set by the reception of the pins 36 and 52 within their slots. Furthermore, the quality protection offered by the electromagnetic shielding at the front ends of the devices by the seals 60 and 62 is controlled according to factory assembly parameters and may be tested for its shielding efficiency before leaving the manufacturer's premises. A high degree of shielding should therefore be expected from the device 10 and should not be subsequently interfered with by the customer who should have no requirement for disassembling the fittings 48 and 50 from the fronts of the two devices.

The relative movement obtained between the two devices 12 and 14 enables the devices to be assembled into the shelf with the connectors 26 being assembled simultaneously into the mating connectors at the back plane or in succession, one after the other. Where it is found that the insertion force is not great, then both of the devices 12 and 14 may be moved towards the rear of the shelf simultaneously with the connectors making simultaneous connection with those of the back plane. For proper alignment with the back plane connectors the pivoting movement towards each other and away of the rear ends of the connectors as shown in FIG. 9 will align the connectors properly together with any vertical movement that is necessary being accommodated by relative vertical movement of the devices as shown by FIG. 8. While the movement towards each other or apart of the rear ends of the devices 12 and 14 is accommodated by bendably flexing the cables 28, the relative movement in the same plane as shown by FIG. 8 must be accommodated by torsional flexing of the cables. Should a single cable 28 be used from top to bottom of the devices 12 and 14, then it is believed that undue torsional stressing of this cable could result between its two extreme positions. However, where more than one cable is provided in the embodiment and as shown by FIG. 5, smaller amounts of permissible torsional stresses are taken by each of the cables individually. Should however the insertion forces be too great to enable both of the devices to be inserted simultaneously, the relative front to back movement of the two devices as shown by the chain-dotted outlines in FIG. 9 and as allowed by movement of the pins along the slots 36 and 56, will enable one of the connectors 26 to be inserted into the back plane connector before insertion of the other connector 26 into position.

As may be seen from the above and according to the invention, assembly of electronic devices is made possible which is very convenient for user assembly into a shelf and for connection to a back plane. Particularly with regard to the first embodiment, where electromagnetic shielding is to be provided, the degree of shielding is guaranteed by factory assembly and testing requirements and no responsibility is placed upon the customer to provide his own shielding effect. Improved shielding performance should therefore be provided together with improved customer acceptance of the product.

Figure 10:
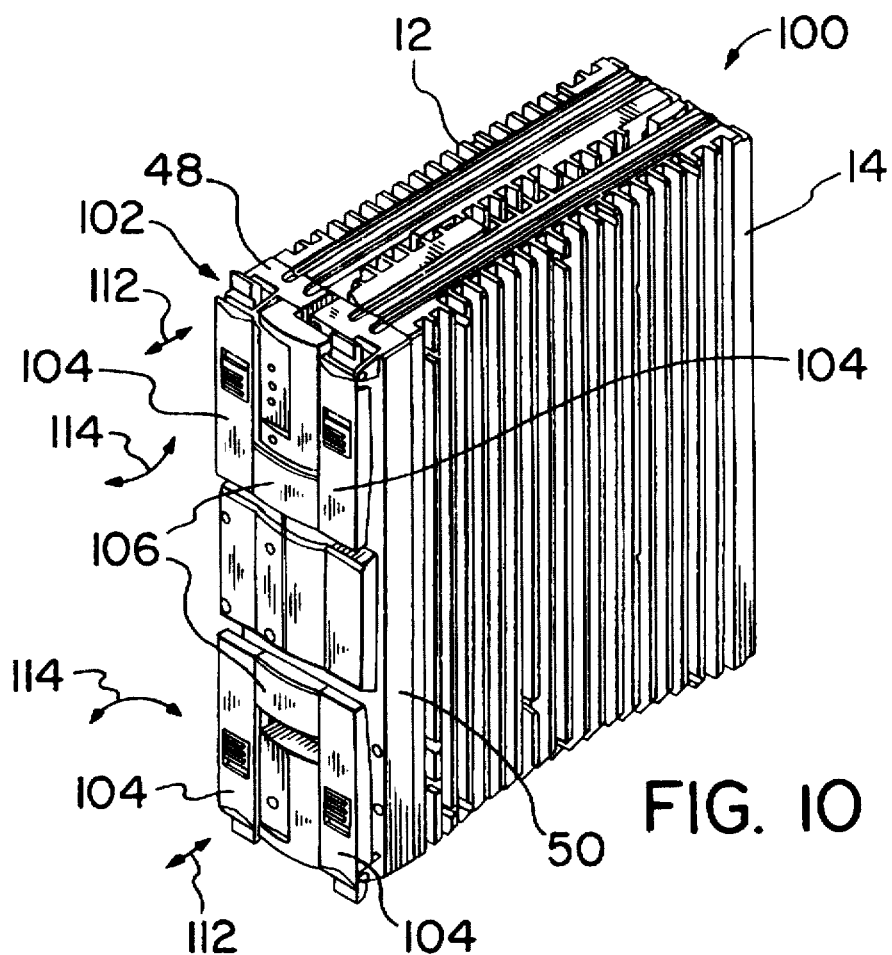
FIG. 10 is an isometric view of a modification to the first embodiment.
Figure 11:
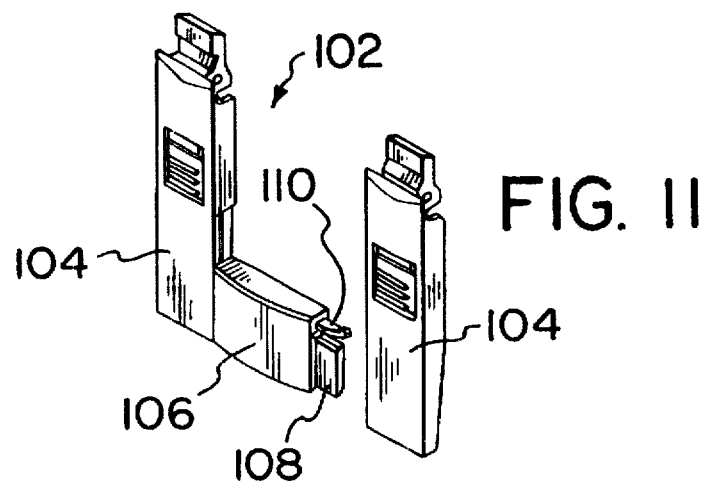
FIG. 11 is a view similar to FIG. 10 of part of the assembly of the modification to the first embodiment, to a larger-scale and in partially exploded condition.

In a modification of the first embodiment as shown by FIGS. 10 and 11, an assembly 100 is basically of the same construction as the first embodiment except for the latch arrangement. Features in the modification similar to the first embodiment bear the same reference numerals.

In the modification, the assembly 100 has a composite latch structure 102. This latch structure 102 comprises two latches 104, one connected to each device 12 and 14. The structure 102 is a sub-assembly in that the latches 104 are loosely joined together by a bridge member 106 which, as shown by FIG. 11, has end extensions 108 received within clearance holes (not shown) in each latch. The bridge member 106 has a latch 110 at each end which latches the bridge member into a latching aperture (not shown) into the corresponding latch 104 to hold the structure 102 together.

The structure 102 is assembled onto the devices 12 and 14. The looseness of the connection between each latch 104 and the bridge member 106 permits relative front to rear movement of the latches 104, as indicated by arrows 112 in FIG. 10, thereby permitting relative front to rear movement of the devices 12 and 14 as shown in FIG. 9. Also, the latches 10 are relatively pivotable as shown by arrows 114 in FIG. 10, thereby allowing for the relative pivotal movement of the devices 12 and 14 shown in FIG. 8.

Figure 12:
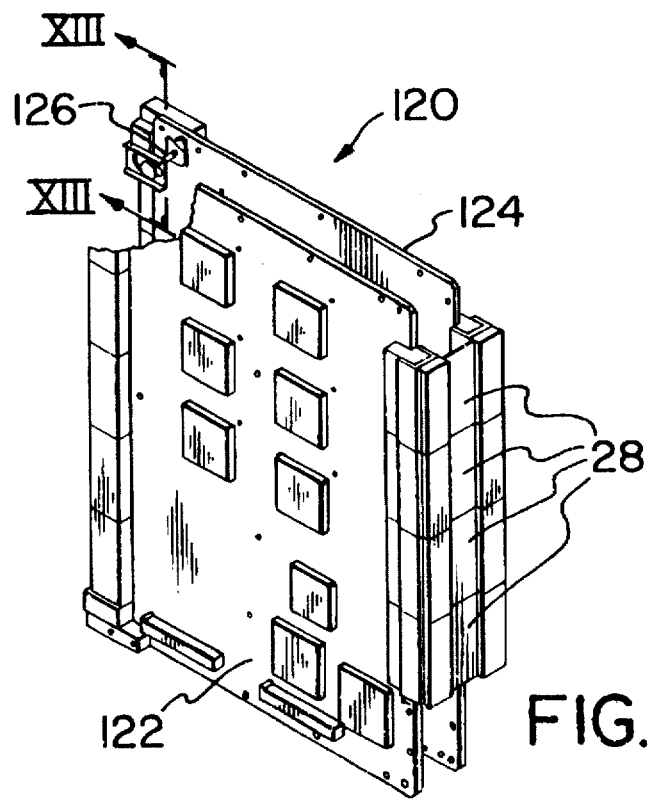
FIG. 12 is an isometric view of an assembly according to a second embodiment.
Figure 13:
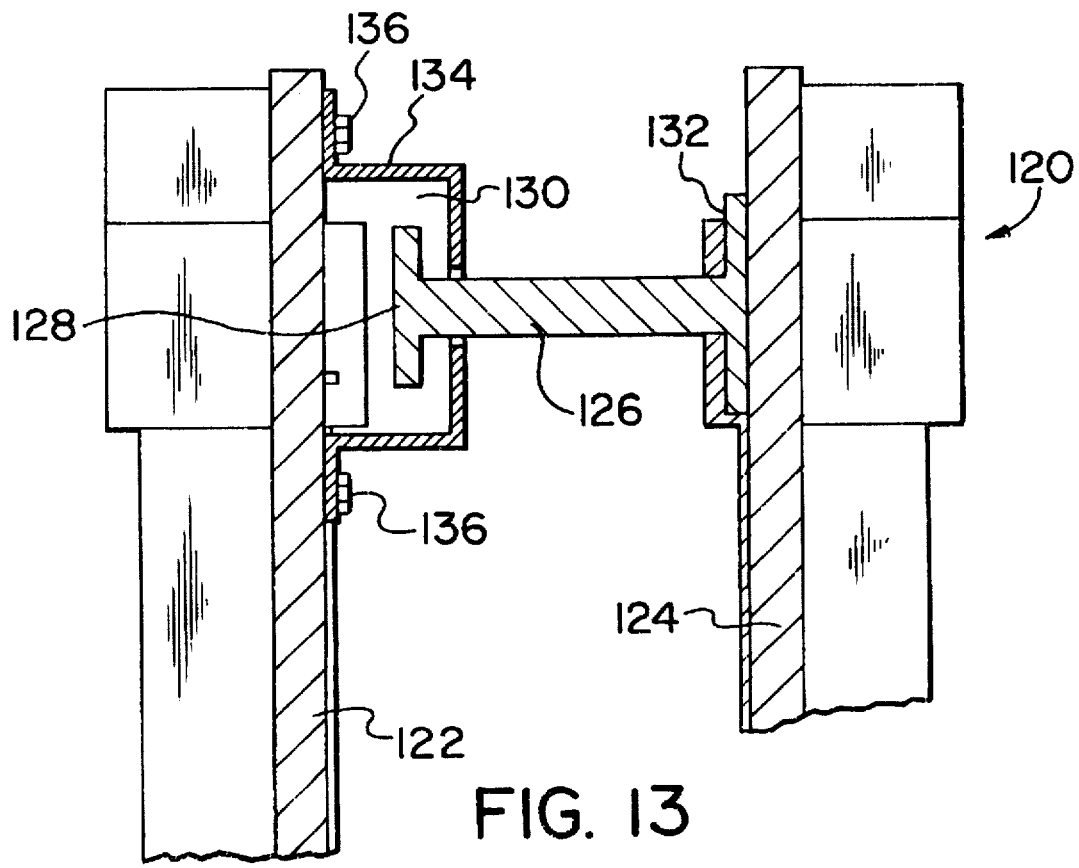
FIG. 13 to a larger scale than FIG. 12 is a cross-sectional view taken along line XIII—XIII in FIG. 12 to show a detail.

In a second embodiment as shown in FIGS. 12 and 13, an assembly 120 comprises two electronics devices in the form of two printed circuit boards 122 and 124 which are connected at front ends by the cables 28 as discussed in the first embodiment. In the second embodiment, heat sinks and EMI protection are not provided. However, the assembly is provided with movement limiting elements which hold the printed circuit boards 122 and 124 in side-by-side relationship while allowing for relative movement of the boards in the three ways discussed with regard to the first embodiment. At both top and bottom and at front and rear, the board 122 has pins 126 with heads 128 which are received into slots 130 of the board 122. Only the pins 126 and slot 130 at the top rear are shown. In each instance, the pins 126 and slots 130 are provided by separate fittings 132 and 134 respectively which are assembled onto the respective boards as shown by FIG. 13. Care should be taken so as not to allow for the boards 122 and 124 to separate after they are assembled together. This may be made possible by assembling either the rear or the front fittings initially and engaging the respective pins 126 into the associated slots 130. With the boards 122 and 124 located in certain relative front to back positions, the other fittings 134 may then be secured into position, perhaps with external screws 136 (FIG. 13) and their respective pins 126 inserted into position. The geometry of the assembly could be such that none of the pins 126 may be removed from its respective slot 130 until the screws 136 have been removed to enable those particularly fittings to be detached from the board 124.

In the second embodiment while the advantages of cooling and electromagnetic shielding are not provided, nevertheless, the assembly is prebuilt under factory conditions for convenience of the customer for installation purposes within a shelf.

What is claimed is:

1. An electronic assembly comprising:
   two planar electronic devices for insertion into a shelf and into connection with a back plane with the devices disposed side-by-side and with each electronic device comprising electrical circuitry lines and electronic components connected by the circuitry lines;
   an electrical connector at a rear end of each of the electronics devices for connection to a mating connector of the back plane;
   a flexible flat cable extending between front ends of the electronic devices to interconnect circuitry lines of one of the electronic devices with those of the other, the flat cable being torsionally flexible to allow relative pivoting movement of the electronic devices in their respective planes and being bendably flexible to allow relative pivoting movement of the electronic devices about the flat cable to move their rear ends towards each other or apart;
   and at least one movement limiting device extending between the electronic devices to limit the amount of their relative pivoting movement in their respective planes and about the flat cable.

2. An electronic assembly according to claim 1 wherein each electronic device comprises a printed circuit board and the two printed circuit boards are interconnected by the flat cable, and the movement limiting device extends between and is secured to the printed circuit boards.

3. An electronic assembly according to claim 1 wherein each electronic device comprises at least one printed circuit board which is housed within a surrounding heat sink and the movement limiting device extends between and is secured to the heat sinks of the two electronic devices.

4. An electronic assembly according to claim 1 wherein the movement limiting device comprises at least one headed pin, the pin carried by one of the electronic devices and having a shank extending into a slot of the movement limiting device and carried by the other electronic device, the pin movable along the slot to permit relative movement of the electronic devices in their planes in one direction of movement, and the pin having the head on a side of the slot to prevent release of the pin from within the slot.

5. An electronic assembly according to claim 4 wherein the pin is permitted to move through the slot in an axial direction of the pin to allow for relative pivoting movement of the electronic devices about the flat cable to move their rear ends towards each other or apart.

6. An electronic assembly according to claim 1 wherein the movement limiting device comprises at least one headed pin, the pin carried by one of the electronic devices and having a shank extending into a slot of the movement limiting device the slot carried by the other electronic device, and the head of the pin preventing release of the pin from within the slot, the pin being permitted to move in the slot in a radial direction of the pin to permit the relative pivoting movement of the devices in their planes.

7. An electronic assembly according to claim 6 wherein the pin is movable along the slot to permit relative movement of the electronic devices in their planes along one direction of movement.

8. An electronic assembly according to claim 7 wherein the pin is permitted to move through the slot in an axial direction of the pin to allow for relative pivoting movement of the electronic devices about the flat cable to move their rear ends towards each other or apart.

9. An electronic assembly according to claim 1 wherein each electronic device comprises at least one printed circuit board which is housed within a surrounding heat sink and a plurality of vertically spaced movement limiting devices which extend between and are secured to the heat sinks at rear end regions of the electronic devices and a plurality of vertically spaced movement limiting devices which extend between and are secured to the heat sinks at front end regions of the electronic devices.

10. An electronic assembly according to claim 9 wherein each movement limiting device comprises at least one headed pin, the pin carried by one of the heat sinks and having a shank extending into a slot of the movement limiting device and which is carried by the other heat sink with the head preventing release of the pin from within the slot, the pin being permitted to move in the slot in a radial direction of the pin to permit the relative pivoting movement of the devices in their planes.

11. An electronic assembly according to claim 10 wherein the pin is movable along the slot to permit relative movement of the electronic devices in their planes along one direction of movement.

12. An electronic device according to claim 11 wherein the pin is permitted to move through the slot in an axial direction of the pin to allow for relative pivoting movement of the electronic devices about the flat cable to move their rear ends towards each other or apart.

* * * * *